(12) United States Patent
Ando et al.

(10) Patent No.: US 8,507,383 B2
(45) Date of Patent: Aug. 13, 2013

(54) FABRICATION OF REPLACEMENT METAL GATE DEVICES

(75) Inventors: Takashi Ando, Tackahoe, NY (US); Leslie Charns, San Jose, CA (US); Jason E. Cummings, Smithfield, NC (US); Lukasz J. Hupka, Croton-On-Hudson, NY (US); Dinesh R. Koli, Tarrytown, NY (US); Tomohisa Konno, Mie (JP); Mahadevaiyer Krishnan, Hopewell Junction, NY (US); Michael F. Lofaro, Danbury, CT (US); Jakub W. Nalaskowski, Yorktown Heights, NY (US); Masahiro Noda, Mie (JP); Dinesh K. Penigalapati, Tarrytown, NY (US); Tatsuya Yamanaka, Mie (JP)

(73) Assignees: International Business Machines Corporation, Armonk, NY (US); JRS Corporation, Tokyo (JP)

(*) Notice: Subject to any disclaimer, the term of this patent is extended or adjusted under 35 U.S.C. 154(b) by 261 days.

(21) Appl. No.: 13/012,879

(22) Filed: Jan. 25, 2011

(65) Prior Publication Data
US 2012/0083121 A1    Apr. 5, 2012

Related U.S. Application Data

(60) Provisional application No. 61/389,546, filed on Oct. 4, 2010.

(51) Int. Cl.
*H01L 21/302* (2006.01)
*C03C 15/00* (2006.01)
*C23F 1/00* (2006.01)

(52) U.S. Cl.
USPC ............... 438/692; 438/693; 216/88; 216/89

(58) Field of Classification Search
USPC .................. 438/692, 693; 216/88, 89
See application file for complete search history.

(56) References Cited

U.S. PATENT DOCUMENTS

| 4,954,459 A | 9/1990 | Avanzino et al. |
| 4,962,064 A | 10/1990 | Haskell et al. |

(Continued)

FOREIGN PATENT DOCUMENTS

| EP | 0853335 A2 | 7/1998 |
| KR | 20030013146 A | 2/2003 |

(Continued)

OTHER PUBLICATIONS

Patent Coopertation Treaty, "The International Search Report and the Written Opinion" Issued for International Patent Application No. PCT/US2011/054545. Apr. 26, 2012. (9 Pages).

(Continued)

*Primary Examiner* — Shamim Ahmed
(74) *Attorney, Agent, or Firm* — Tutunjian & Bitetto, P.C.

(57) ABSTRACT

Methods for polishing multiple dielectric layers to form replacement metal gate structures include a first chemical mechanical polish step to remove overburden and planarize a top layer to leave a planarized thickness over a gate structure. A second chemical mechanical polish step includes removal of the thickness to expose an underlying covered surface of a dielectric of the gate structure with a slurry configured to polish the top layer and the underlying covered surface substantially equally to accomplish a planar topography. A third chemical mechanical polish step is employed to remove the dielectric of the gate structure and expose a gate conductor.

24 Claims, 4 Drawing Sheets

(56) References Cited

U.S. PATENT DOCUMENTS

| | | | |
|---|---|---|---|
| 5,173,439 | A | 12/1992 | Dash et al. |
| 5,712,185 | A | 1/1998 | Tsai et al. |
| 5,736,462 | A | 4/1998 | Takahashi et al. |
| 5,738,800 | A | 4/1998 | Hosali et al. |
| 5,759,917 | A | 6/1998 | Grover et al. |
| 5,938,505 | A | 8/1999 | Morrison et al. |
| 5,961,794 | A | 10/1999 | Morita |
| 6,015,755 | A | 1/2000 | Chen et al. |
| 6,114,249 | A | 9/2000 | Canaperi et al. |
| 6,117,748 | A | 9/2000 | Lou et al. |
| 6,319,836 | B1 | 11/2001 | Dunton et al. |
| 6,361,402 | B1 | 3/2002 | Canaperi et al. |
| 6,491,843 | B1 | 12/2002 | Srinivasan et al. |
| 6,544,892 | B2 | 4/2003 | Srinivasan et al. |
| 6,580,137 | B2 | 6/2003 | Parke |
| 6,616,514 | B1 | 9/2003 | Edelbach et al. |
| 6,617,251 | B1 | 9/2003 | Kamath et al. |
| 6,743,683 | B2 | 6/2004 | Barns et al. |
| 6,746,316 | B2 | 6/2004 | Chopra et al. |
| 6,756,643 | B1 | 6/2004 | Achuthan et al. |
| 6,812,076 | B1 | 11/2004 | Achuthan et al. |
| 6,824,579 | B2 | 11/2004 | Ronay |
| 6,855,607 | B2 | 2/2005 | Achuthan et al. |
| 6,964,923 | B1 | 11/2005 | Ronay |
| 6,982,464 | B2 | 1/2006 | Achuthan et al. |
| 7,029,509 | B2 | 4/2006 | Kim et al. |
| 7,071,105 | B2 | 7/2006 | Carter et al. |
| 7,091,164 | B2 | 8/2006 | Srinivasan et al. |
| 7,125,321 | B2 | 10/2006 | Prince et al. |
| 7,125,776 | B2 | 10/2006 | Achuthan et al. |
| 7,166,506 | B2 | 1/2007 | Prince et al. |
| 7,217,989 | B2 | 5/2007 | Hiramitsu et al. |
| 7,271,088 | B2 | 9/2007 | Jung et al. |
| 2004/0266115 | A1* | 12/2004 | Chan et al. ............ 438/284 |
| 2008/0045014 | A1 | 2/2008 | Chen et al. |
| 2008/0305610 | A1 | 12/2008 | Chen et al. |
| 2009/0057769 | A1 | 3/2009 | Wei et al. |
| 2009/0087974 | A1 | 4/2009 | Waite et al. |
| 2010/0048007 | A1 | 2/2010 | Lee et al. |
| 2010/0059823 | A1 | 3/2010 | Chung et al. |
| 2010/0062577 | A1 | 3/2010 | Liao et al. |
| 2011/0227167 | A1* | 9/2011 | Chuang et al. ............ 257/379 |

FOREIGN PATENT DOCUMENTS

| | | |
|---|---|---|
| KR | 20080084293 A | 9/2008 |
| KR | 20080101454 A | 11/2008 |
| KR | 20090026984 A | 3/2009 |
| KR | 20090038141 A | 4/2009 |

OTHER PUBLICATIONS

America, W., et al. "Slurry Additive Effects on the Suppression of Silicon Nitride Removal During CMP" Electrochemical and Solid-State Letters, vol. 7, Issue 12. Nov. 2004. pp. 327-330.

Arnaud, F., et al. "32NM General Purpose Bulk CMOS Technology for High Performance Applications At Low Voltage" IEDM Technical Digest, Dec. 2008. pp. 633-636.

Auth, C., et al. "45NM High-K + Metal Gate Strain-Enhanced Transistors" 2008 Symposium on VLSI Technology Digest of Technical Papers. 2008. pp. 128-129.

Blumenstock, K., et al. "Shallow Trench Isloation for Ultra-Large-Scale Integrated Devices" J. Vac. Sci. Technol. B 12(1). Jan.-Feb. 1994. pp. 54-58.

Boning, D., et al. "Nanotopography Issues in Shallow Trench Isolation CMP" Material Research Society (MRS) Bulletin. Oct. 2002. pp. 761-765.

Boyd, J., et al. "A One-Step Shallow Trench Global Planarization Process Using Chemical Mechanical Polishing" Journal of the Electrochemical Society, vol. 144, No. 5. May 1997. pp. 1838-1841.

Bu, K., et al. "Selective Chemical Mechanical Polishing Using Surfactants" Journal of the Electrochemical Society, vol. 154, Issue 7. May 2007. pp. 631-635.

Chau, R. "Advanced Metal Gate/High-K Dielectric Stacks for High-Performance CMOS Transistors" Proceedings of the American Vacuum Society 5th International Conference on Microelectronics and Interfaces (ICMI). Mar. 2004. (3 Pages).

Chau, R., et al. "30NM Physical Gate Length CMOS Transistors With 1.0 PS N-MOS and 1.7 PS P-MOS Gate Delays" 2000 International Electron Devices Meeting, Dec. 2000. pp. 45-48.

Chau, R., et al., "High-K/Metal-Gate Stack and Its MOSFET Characteristics" IEEE Electron Device Letters, vol. 25, No. 6, Jun. 2004. pp. 408-410.

Choi, J., et al. "Chip Scale Prediction of Nitride Erosion in High Selectivity STI CMP" Proceedings of 2006 CMP-MIC. Feb. 2006. (10 Pages).

Choi, J., et al., "Chip Scale Topography Evolution Model for CMP Process Optimization" Proc. 2005 IEEE International Symposium on Semiconductor Manufacturing, IEEE. Sep. 2005. (6 Pages).

Choi, K., et al. "Extremely Scaled Gate-First High-K/Metal Gate Stack With EOT of 0.55 NM Using Novel Interfacial Layer Scavenging Techniques for 22NM Technology Node and Beyond" 2009 Symposium on VLSI Technology Digest of Technical Papers. Jun. 2009. pp. 138-139.

Colinge, J. "FINFETS and Other Multi-Gate Transistors" Integrated Circuits and Systems. Nov. 2007. (5 Pages).

Cummings, J., et al. "A Comparative Study of Ceria-Based and Silica-Based Slurries for 32NM Shallow Trench Isolation Chemical Mechanical Planarization" Thirteenth International C.M.P. Planarization for ULSI Multilevel Interconnection Conference. Mar. 2008. (8 Pages).

Davari, B., et al., "A New Planarization Technique, Using a Combination of Rie and Chemical Mechanical Polish (CMP)" Electron Devices Meeting, 1989. IEDM '89. Technical Digest., International. Dec. 1989, pp. 61-64.

Haensch, W., et al. "Silicon CMOS Devices Beyond Scaling" IBM Journal of Research and Development, vol. 50, No. 4/5. Jul.-Sep. 2006, pp. 339-361A.

Harris, H., et al. "Band-Engineered Low PMOS VT with High-K/Metal Gates Featured in a Dual Channel CMOS Integration Scheme" 2007 Symposium on VLSI Technology Digest of Technical Papers. Jun. 2007. pp. 154-155.

Ishihara, T., et al. "Universal Mobility Modeling and Its Application to Interface Engineering For Highly Scaled MOSFETs Based on First-Principles Calculation" 2009 IEEE. International Electron Devices Meeting, IEDM '09. Dec. 2009. pp. 75-78.

Kahng, A., et al. "Fill for Shallow Trench Isolation CMP" 2006 International Conference on Computer-Aided Design (ICCAD'06). Nov. 2006. (8 Pages).

Kaneko, A., et al. "Sidewall Transfer Process and Selective Gate Sidewall Spacer Formation Technology for Sub-15NM FINFET With Elevated Source/Drain Extension" IEEE International Electron Device Meeting (IEDM 2005). Dec. 2005. (4 Pages).

Kotlyar, R., et al. "Inversion Mobility and Gate Leakage in High-K/Metal Gate MOSFETs" IEEE International Electron Devices Meeting (IEDM 2004). Dec. 2004. pp. 391-394.

Lai, C., et al. "A Novel 'Hybrid' High-K/Metal Gate Process for 28NM High Performance CMOSFETs" IEEE International Electron Devices Meeting (IEDM 2009). Dec. 2009. pp. 655-658.

Lee, B. "Modeling of Chemical Mechanical Polishing for Shallow Trench Isolation" Massachusetts Institute of Technology: Department of Electrical Engineering and Computer Science. Thesis Paper. May 2002. (201 Pages).

Lee, B., et al. "Using Smart Dummy Fill and Selective Reverse Etchback for Pattern Density Equalization" Proc. CMP-MIC. Feb.-Mar. 2000. pp. 255-258.

Mistry, K., et al. "A 45NM Logic Technology With High-K+Metal Gate Transistors, Strained Silicon, 9 CU Interconnect Layers, 193 NM Dry Patterning, and 100% PB-Free Packaging" IEEE International Electron Devices Meeting (IEDM 2007). Dec. 2007. (4 Pages).

Pan, J., et al. "Planarization and Integration of Shallow Trench Isolation" 1998 VMIC. VLSI Multilevel Interconnect Conference. Jun. 1998. pp. 1-6.

Prasad, Y., et al. "Role of Amino-Acid Adsorption on Silica and Silicon Nitride Surfaces During STI CMP" Electrochemical and Solid-State Letters, vol. 9, Issue 12. Sep. 2006. pp. 337-339.

Ranade, R., et al. "High Performance 35NM LGate CMOS Transistors Featuring NISI Metal Gate (FUSI), Uniaxial Strained Silicon Channels and 1.2NM Gate Oxide" IEEE International Electron Devices Meeting (IEDM 2005). Dec. 2005. (4 Pages).

Romer, A., et al. "STI CMP Using Fixed Abrasive Demands, Measurement Methods and Results" CMP-MIC, Mar. 2000. (10 Pages).

Schlueter, J. "Trench Warfare: CMP and Shallow Trench Isolation" Semiconductor International. Oct. 1999. (5 Pages).

Steigerwald, J. "Chemical Mechanical Polish: The Enabling Technology" IEEE International Electron Devices Meeting (IEDM 2008). Dec. 2008. pp. 37-39.

Takahashi, H., et al. "Interaction Between Ultrafine Ceria Particles and Glycine" Journal of Ceramic Processing Research. vol. 5, No. 1. 2004. pp. 25-29.

Tomimatsu, T., et al. "Cost Effective 28-NM LSTP CMOS Using Gate-First Metal Gate/High-K Technology" 2009 Symposium on VLSI Technology Digest for Technical Papers. Jun. 2009. pp. 36-37.

Veera, R., et al. "Selective Chemical Mechanical Polishing of Silicon Dioxide Over Silicon Nitride for Shallow Trench Isolation Using Ceria Slurries" Journal of the Electrochemical Society. vol. 156, Issue 12. Oct. 2009. pp. 936-943.

Vo, T., et al. "Improved Planarization for STI With Fixed Abrasive Technology" Solid State Technology. Jun. 2000. (7 Pages).

Xie, X., et al. "Integrated Modeling of Nanotopography Impact in Patterned STI CMP" Microsystems Technology Laboratories. ULSI Multilevel Interconnect Conference. Feb. 2003. pp. 1-23. http://www-mtl.mit.edu/researchgroups/Metrology/PAPERS/CMPMIC-nanomodel-talk-feb2003.pdf.

* cited by examiner

FABRICATION OF REPLACEMENT METAL GATE DEVICES

RELATED APPLICATION INFORMATION

This application claims priority to U.S. Provisional Ser. No. 61/389,546 filed on Oct. 4, 2010, incorporated herein by reference in its entirety.

This application is related to commonly assigned applications: Ser. No. 13/012,142, filed Jan. 24, 2011; Ser. No. 13/012,821, filed Jan. 25, 2011; and Ser. No. 13/012,836, filed Jan. 25, 2011, all incorporated herein by reference.

TECHNICAL FIELD

The present invention relates to semiconductor fabrication and devices, and in particular to systems and methods for chemical mechanical planarization (CMP) of high-k metal gate structures to achieve a highly planar final structure.

RELATED ART

The great success of the complementary metal oxide semiconductor (CMOS) technology can be attributed to transistor scalability. For over a quarter of a century, very little has changed in the basic transistor design except the dimensions. The scaling concept requires that all the physical dimensions (length, width and thickness) be reduced simultaneously. As these physical dimensions start approaching molecular scales, it has become extremely difficult to achieve performance gain by simple device scaling alone. Several strategies involving new device structures and material options are being developed in an attempt to extend the planar transistor design and preserve device scaling beyond ~50 nm gate length.

One way to solve the device scaling problems is to use different materials in a gate structure. A $SiO_2$ gate oxide is a material that has enabled scaling of CMOS devices to gain performance improvements in the past. The physical thickness of gate oxide in transistors has been decreasing steadily with the decrease in gate length. For a 90 nm node, for example, the thickness of gate oxide is about 12 Å and experimental transistors with 8 Å gate oxide thickness have been reported. However, continued gate oxide scaling is becoming extremely difficult because the gate oxide leakage in $SiO_2$ increases with decreasing physical thickness, and $SiO_2$ can no longer play its role effectively as the gate dielectric.

SUMMARY

Methods for polishing to form replacement metal gate structures include a first chemical mechanical polish step to remove overburden and planarize a top layer to leave a planarized thickness over a gate structure. A second chemical mechanical polish step includes removal of the thickness to expose an underlying covered surface of a dielectric of the gate structure with a slurry configured to polish the top layer and the underlying covered surface substantially equally to accomplish a planar topography. A third chemical mechanical polish step removes the dielectric of the gate structure and exposes a gate conductor.

A method for the planarization of high-k metal gate structures is described. The strategy is to use slurries with appropriate selectivity to polish certain materials in preference to other materials to achieve a highly planar final structure. In the case of high-k metal gate devices, a three step CMP process is provided. The first step is a planarization step with an oxide selective slurry stopping on 300 to 600 Å of oxide remaining The second step involves polishing with a slurry that has a selectivity ratio of 1:1:1 with respect to oxide, nitride and polysilicon (poly Si). In next step, a slurry with a high polish rate for nitride and very low polish rates for oxide and poly Si is used. The compositions of the slurries used for the various polish steps are also disclosed.

A method for polishing replacement metal gate structures to planarize oxide layers and expose underlying nitride and polysilicon covered areas includes a first chemical mechanical polish step to remove overburden and planarize oxide layers leaving 300 to 600 Å of oxide remaining; a second chemical mechanical polish step including removal of the oxide layers and exposing underlying nitride and polysilicon covered surfaces with an oxide: nitride: polysilicon selectivity of about 1:1:1 to about 2:1:1 to provide planar topography; a third chemical mechanical polish step to remove the nitride layers and expose the polysilicon layers; and replacing at least a portion of the polysilicon layer with a metal layer to form the metal gate structure.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1A:
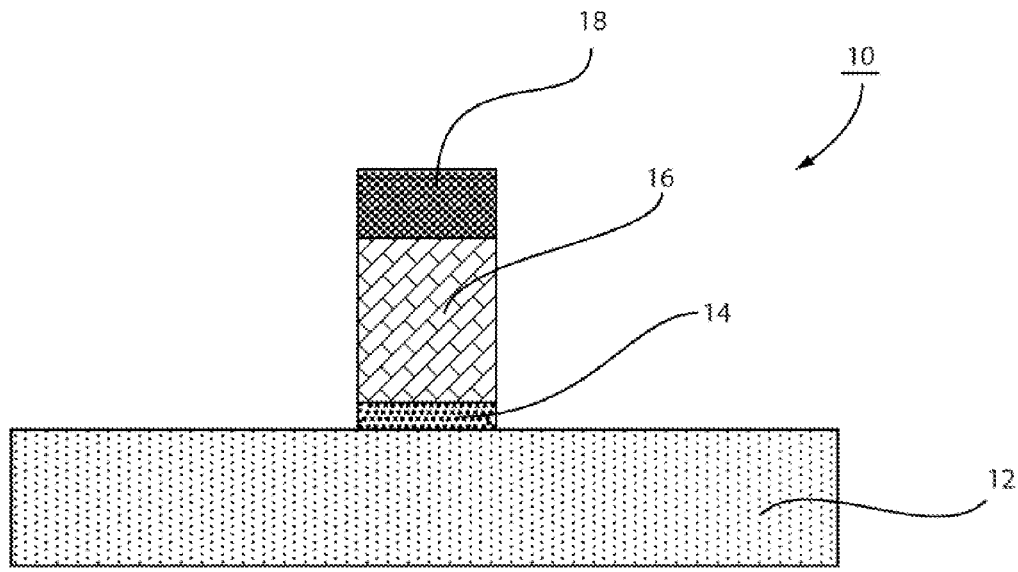
FIGS. 1A-1F are cross-sectional views showing process steps for fabrication of a replacement high-k metal gate structure in accordance with one embodiment.

In accordance with the present principles, methods for planarization of high-k metal gate structures are described. One strategy is to use slurries with appropriate selectivity to polish certain materials in preference to other materials to achieve a highly planar final structure. In the case of high-k metal gate devices, a three step CMP process is provided. In one embodiment, a planarization step is performed on an oxide layer with a selective slurry stopping with approximately 300 to 600 Å of oxide remaining. A next step includes polishing with a slurry that has a selectivity ratio of 1:1:1 with respect to oxide, nitride and polysilicon. Then, a slurry is employed for polishing with a high polish rate for nitride and very low polish rates for oxide and polysilicon. Compositions of the slurries used for the various polish steps are disclosed.

It is to be understood that the flowchart and block diagrams in the Figures may, in some alternative implementations, occur out of the order noted in the figures. For example, two blocks shown in succession may, in fact, be executed substantially concurrently, or the blocks may sometimes be executed in the reverse order, depending upon the functionality involved.

It is also to be understood that the present invention will be described in terms of given illustrative architectures; however, other architectures, structures, substrate materials and process features and steps may be varied within the scope of the present invention. Throughout this disclosure oxide, nitride and polysilicon materials are described. However, these materials are illustrative and other materials are also contemplated and within the scope of the invention. In addition, dimensions of thicknesses are described throughout this disclosure. These thickness dimensions are illustrative and other dimensions may be employed in accordance with the present principles.

Devices as described herein may be part of a design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

High dielectric constant (high-k) materials such as hafnium and zirconium based oxides and silicates reduce leakage current significantly (e.g., by 100×) and can be used at higher thickness then, e.g., $SiO_2$. However, replacing $SiO_2$ with high-k materials in polysilicon gates leads to two major problems. Because of the defects that form at the gate dielectric/polysilicon gate electrode interface, a voltage at which the transistor switches (threshold voltage $V_t$) becomes too high. Secondly, electron mobility in the device channel is severely degraded due to surface phonon scattering. Both these problems affect the transistor switching speeds. Use of metal gates with appropriate work functions can provide the right threshold voltages ($V_t$) and significantly reduce channel mobility degradation. With the combination of high-k gate dielectrics and metal gates, the transistor performance can be significantly improved, and scaling below ~50 nm becomes possible.

For the fabrication of metal gate devices in conventional CMOS processing, high temperature dopant activation is employed. Most metals with a high work function are stable at these temperatures. However, the interface between the high-k dielectric and work function metal is sensitive to high temperature processing and significant changes occur in the interfacial characteristics. This manifests as $V_t$ variations and decreased device reliability. Thus, the materials used in the metal gate stack determine the device integration run path.

A metal gate structure with stack materials that can withstand high temperature processing can be integrated with a gate-first fabrication approach, which may be compatible with conventional CMOS processing. Any metal gate structure with stack materials that cannot withstand high temperature processing needs to be built after all the front-end processing steps, including high temperature junction activation. This integration method involves fabrication of sacrificial polysilicon gates and replacing these sacrificial gates with metal gates (hence the name: replacement metal gate).

Referring now to the drawings in which like numerals represent the same or similar elements and initially to FIGS. 1A-1F, a process flow including several chemical mechanical polishing (CMP) steps for a gate-last or damascene metal gate flow are illustratively shown for a fabrication of a high-k metal gate structure in accordance with the present principles. The following description will illustratively describe the process flow using oxide, nitride and polysilicon on a silicon substrate. However, it should be understood that other materials may be employed.

In FIG. 1A, a device 10 includes a gate oxide layer 14 formed on a substrate 12. The substrate 12 may include a bulk silicon material, other bulk material or may include a semiconductor-on-insulator (SOI) structure. Other materials or structures may be employed. A polysilicon layer 16 is formed on the oxide 14 followed by a nitride layer 18. The stack of layers (oxide 14, polysilicon 16 and nitride 18) is patterned to form a gate stack. In a particularly useful embodiment layer 14 may include silicon dioxide or other high k dielectric materials such as oxides and silicates of metals such as Hafnium and the like.

Figure 1B:
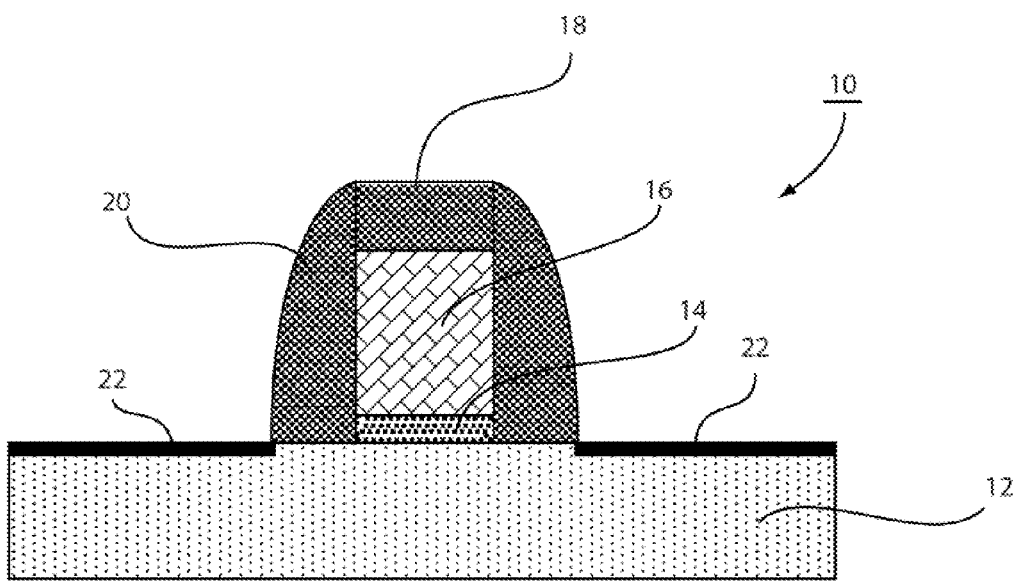

In FIG. 1B, a spacer 20 is formed on side walls of the gate stack. The spacer may be formed by a rapid thermal chemical vapor deposition (RTCVD) of SiN or equivalent process. This may be followed by a spacer etch back to complete the spacers 20. A silicide process is employed to form silicided junctions 22.

Figure 1C:
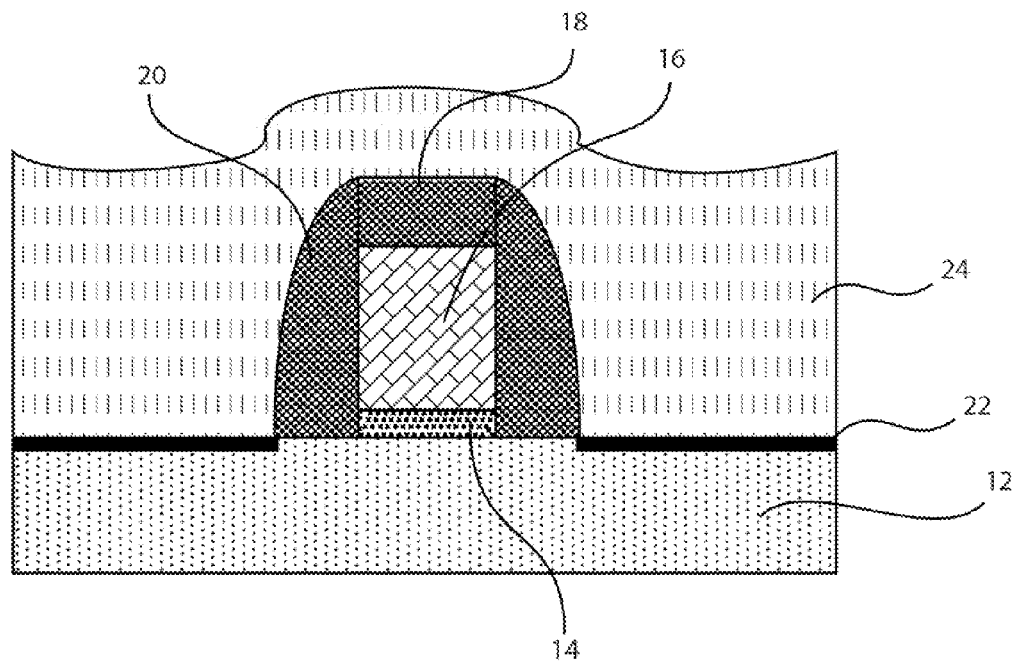
Figure 1D:
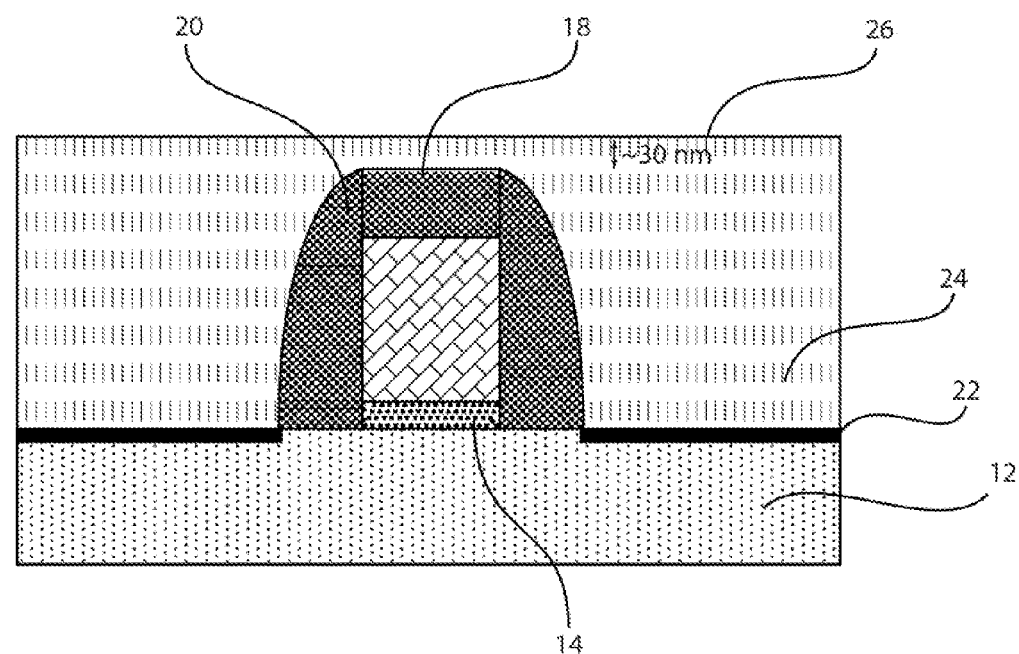

Planarization processes for high-k metal gate devices will now be described. In FIG. 1C, an oxide layer 24 is formed over the gate structures and the adjacent silicided regions 22. In FIG. 1D, excess oxide overburden is removed to form a surface 26. In one embodiment, approximately 300-600 Å of oxide remains over nitride 18 after polishing. For this planarization, an oxide polish slurry with, e.g., a 4:1 oxide to nitride selectivity or ceria/surfactant based slurry may be employed.

Figure 1E:
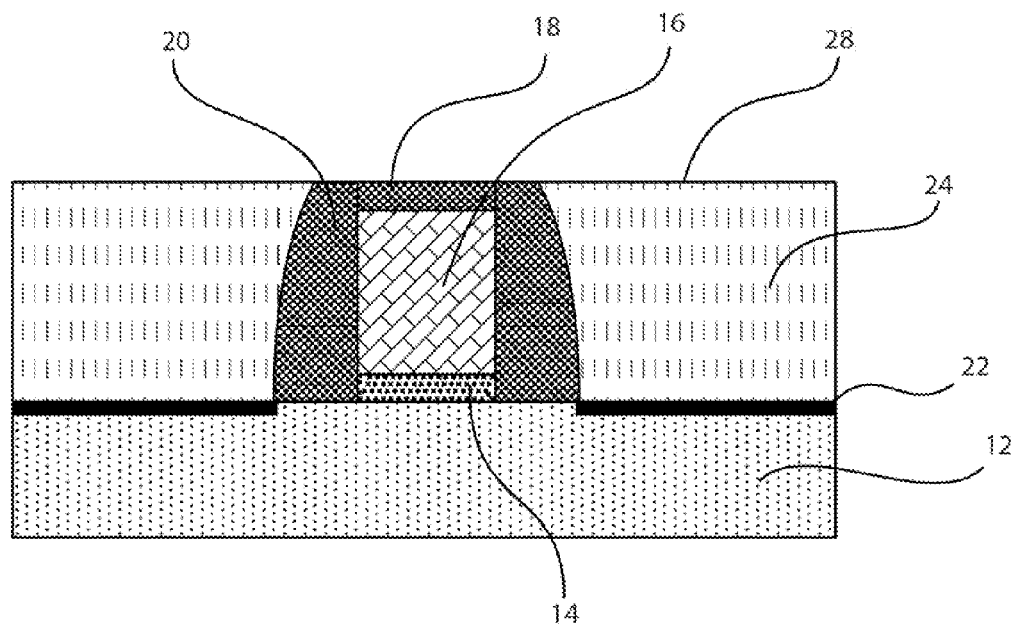

In FIG. 1E, another planarization is performed with a slurry with approximately 1:1 oxide to nitride polish rate selectivity. This achieves equal polish rates for oxide and nitride in the various parts of the structure to avoid dishing and erosion due to differences in the polish rates of the two materials, e.g., oxide 24 and nitride 18 and 20. About 100 to 200 Å of nitride 18 remains after this step to form surface 28. The oxide 24 is preferably completely removed over the gate structure and the nitride 18 and 20 is exposed everywhere in the chip after this step. To ensure that no oxide 24 is left on top of nitride 18 and 20, an additional wet etch with, e.g., diluted HF, may be employed.

Figure 1F:
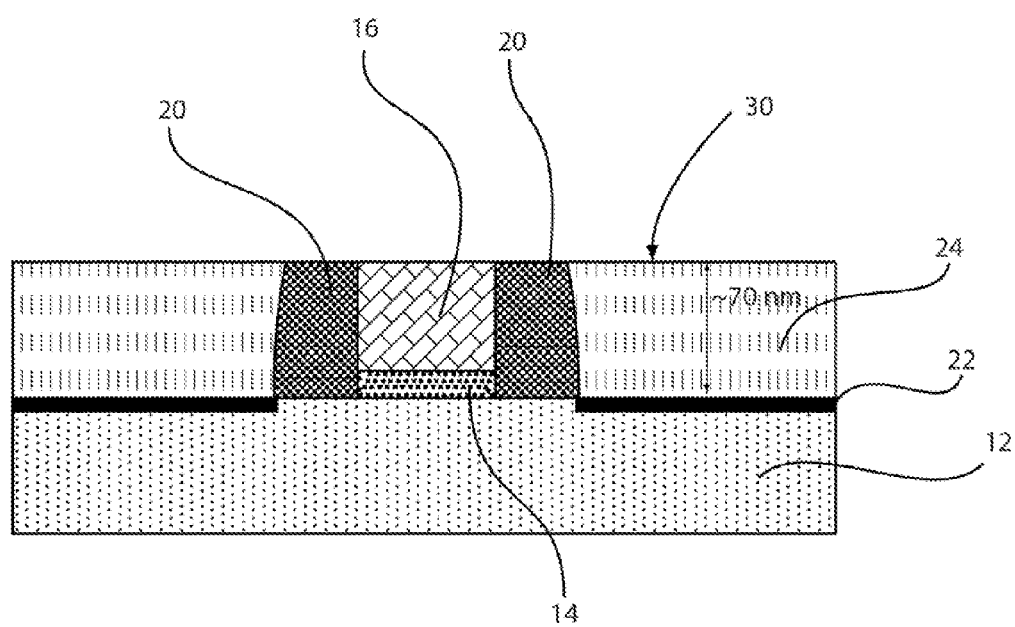

In FIG. 1F, a next step is to polish nitride 18 and expose polysilicon 16. This is accomplished by a slurry with high selectivity towards nitride 18, 20 with very low polish rates for oxide 24 and polysilicon 16. One advantage of the process is that it provides the flexibility of using slurries with different selectivity to achieve a highly planar post polish topography (surface 30). This process employs slurries that are capable of providing different polish rates for oxide 24, nitride 18, 20 and polysilicon 16 layers which can be varied to achieve highly planar post polish topography. In subsequent steps, the polysilicon 16 is removed in whole or in part (sacrificial polysilicon gate) and is replaced with a metal where the polysilicon had been removed. The metal forms a metal gate structure (hence the name replacement metal gate). A metal such as copper, aluminum, silver, gold, etc. may be formed in place of the polysilicon 16. This provides a gate dielectric 14 layer (e.g., $SiO_2$ or high k dielectric) with a metal gate conductor (to form a structure compatible with a high-k metal gate structure).

Slurry compositions for the three step CMP process for high-k metal gate applications may include the following. For the CMP slurry employed to achieve FIG. 1D, the large initial topography is reduced while removing the bulk of the oxide overburden and leaving a planar oxide layer 24 of approximately 300 Å every where in the semiconductor device (die). Since a high oxide removal rate is desired and virtually no nitride surfaces are exposed during the initial stages of polish, the slurry selectivity is not a factor. This can be achieved by oxide polish slurries with, e.g., approximately 4:1 oxide to nitride selectivity. The oxide slurries may comprise alkaline compounds like potassium hydroxide or ammonium hydroxide and silica abrasives which are selected from fumed silica and colloidal silica. However, to improve the planarity and achieve uniform oxide thickness across various pattern densities, it may be necessary to incorporate additives to the oxide slurries. Ceria/surfactant systems can also be used in this step to achieve the desired planarity and uniformity.

For a CMP slurry to achieve FIG. 1E and/or FIG. 1F, the remaining ~300 Å of the oxide layer 24 is removed to expose underlying surfaces (nitride 18, 20) and achieve a highly planar final surface 28 that is free of defects such as polish scratches, pits and other blemishes. To achieve high planarity, it is necessary to have approximately the same polish rates for oxide 24, nitride 18, 20 and polysilicon 16 covered surfaces. The polish rates of oxide, nitride and polysilicon should not be very high since this inevitably will lead to poor controllability. Thus, it would be highly desirable to have slurry that has polish rates in the range of 300 to 600 Å/min for the three materials. This will provide appropriate polish times with good controllability and allow over-polish margins to planarize hard to polish structures.

The polish rates of different materials vary with line width, pattern density and feature size in an actual circuit layout. The local polish rates of different materials in patterned structures are very complex functions of the polish rates of the same materials in blanket wafers. Thus, it is necessary to optimize the slurry selectivity by polishing patterned wafers and measuring the planarity experimentally to ensure that the desired goals are achieved. Since the die layouts vary between technology nodes and even among different products in the same technology node, it is highly desirable to be able to change the polish rate selectivity by varying the concentrations of the components in the slurry. Thus, polish rate selectivity should be "tunable" within a range for the slurry system to be usable across a wide range of products and technology nodes. The ability to tune the polish rate selectivity is a factor in the polish steps for FIGS. 1E and 1F in achieving a highly planar final surface using the present methods.

A slurry according to the present embodiments may include the following components: a) Abrasive, b) pH modulator, c) Organic acid. a) Abrasive: The abrasive may be at least one type of abrasive particle selected from inorganic and/or organic materials. Examples of the inorganic abrasive particles include silica, alumina, titania, zirconia, ceria, and the like. Examples of the silica may include fumed silica, silica synthesized by a sol-gel method, and colloidal silica. The fumed silica may be obtained by reacting silicon tetra chloride with oxygen and water in gaseous phase. The silica synthesized by the sol-gel method may be obtained by hydrolysis and/or condensation of an alkoxysilicon compound. The colloidal silica may be obtained by hydrolysis of purified silicon compounds in solution phase. Examples of the organic particles may include polyvinyl chloride, styrene (co)polymer, polyacetal, polyester, polyamide, polycarbonate, olefin (co)polymers, phenoxy resins, and acrylic (co) polymers. Examples of the olefin (co)polymers include polyethylene, polypropylene, poly-1-butene, and poly-4-methyl-1-pentene. Examples of the acrylic (co)polymers include polymethyl methacrylate and the like. An average particle diameter of the abrasive may be in the range 5 to 500 nm, more preferably 20 to 150 nm. An appropriate polishing rate can be achieved using the abrasive particles having an average diameter within this range. The colloidal silica may be obtained commercially (e.g., from Fuso Chemical Co., Ltd., Japan) with a primary particle diameter of, e.g., 35 nm. This colloidal silica abrasive is an example of a commercial silica abrasive and is used in that capacity in the examples mentioned herein.

b) pH modulator: The pH of the slurry according to the present embodiments is in the range 1 to 11 and preferably 2 to 6. An appropriate polish rate can be achieved by adjusting the pH of the slurry to a value within this range. Examples of pH modulators may include organic bases, inorganic bases, and inorganic acids. Examples of organic bases include tetramethylammonium hydroxide, triethylamine, and the like. Examples of the inorganic bases may include ammonium hydroxide, potassium hydroxide, and sodium hydroxide. Examples of the inorganic acids may include nitric acid, sulfuric acid, phosphoric acid, and hydrochloric acid.

c) Organic acid: Organic acid is used as an accelerator for nitride polishing. Various organic acids such as monobasic acids (e.g., monocarboxylic acids), dibasic acids (e.g., dicarboxylic acids), polybasic acids (e.g., polycarboxylic acids), and carboxylic acids with substituted groups (hydroxyl, amine) can be used. Examples of such organic acids may include saturated acids, unsaturated acids, aromatic acids, and aliphatic acids. Examples of the saturated acids may include formic acid, acetic acid, butyric acid, oxalic acid, malonic acid, succinic acid, glutaric acid, and adipic acid. Examples of the acids containing hydroxyl groups may include lactic acid, malic acid, tartaric acid, and citric acid. Examples of the unsaturated acids include maleic acid and fumaric acid. Examples of the aromatic acids may include benzoic acid and phthalic acid. It is preferable to use an organic acid having two or more carboxylic acid groups to obtain high polish rates of nitride. The potassium or ammonium salts of these organic acids may also be used.

Other components: The addition of other ingredients into the slurry may be provided to tune the oxide to nitride (and to polysilicon) selectivity. The slurry according to these embodiments may include a surfactant, if necessary. Examples of surfactants may include anionic, nonionic, and cationic surfactants. Examples of anionic surfactants may include a surfactant containing at least one functional group selected from a carboxyl group (—COOX), a sulfonic acid group (—$SO_3X$), and a phosphate group (—$HPO_4X$) (wherein X represents hydrogen, ammonium, or a metal). Examples of the anionic surfactants may include aliphatic and aromatic sulfates and sulfonates, and phosphate salts. Compounds such as potassium dodecylbenzenesulfonate, ammonium dodecylbenzenesulfonate, sodium alkylnaphthalenesulphonate, alkyl sulfosuccinate, potassium alkenylsuccinate may be used. Salts of fatty acids like potassium oleate may be employed. These anionic surfactants may be used either individually or in combination with other surfactants. Examples of the nonionic surfactants include polyoxyethylene alkyl ethers, ethylene oxide-propylene oxide block copolymers, acetylene glycol, ethylene oxide addition product of acetylene glycol, acetylene alcohol, and the like. Note that a nonionic polymer such as polyvinyl alcohol, cyclodextrin, polyvinyl methyl ether, or hydroxyethylcellulose may also be used. Examples of the cationic surfactants may include an aliphatic amine salts and aliphatic ammonium salts. In addition, polyelectrolytes such as poly (acrylic acid) and their salts such as sodium, potassium and ammonium can also be added during the polishing to control the selectivity. The present embodiments may include the functions of the components of the slurry which are further described below by way of examples. Note that the present invention is not limited to the following examples.

Example 1

The slurry suitable for achieving FIG. 1E includes: Silica abrasives in the range of 0.5 to 30% by weight, the preferred range being 5 to 10% by weight, Organic acid in the range of 0.5 to 50 g/L, the preferred range being 3 to 25 g/L, Acidic pH modulator in the range of 0.01 to 5 g/L, the preferred range being 0.1 to 2.0 g/L, Alkaline pH modulator in the range of 0 to 5 g/L, the preferred range being 0 to 2 g/L, the pH of the slurry in the range of 1 to 11, the preferred range being 2 to 6.

Example 2

One example of the formulation of example 1 includes: 5 W % of colloidal silica abrasives dispersed in water, 5 g/L of citric acid, 0.25 to 0.35 g/L of phosphoric acid, 0.1 to 0.5 g/L of ammonium hydroxide, pH in the range of 2-5, the preferred pH being ~4.

Example 3

Another example of the formulation of example 1 includes: 10 W % of colloidal silica abrasives dispersed in water, 10 g/L of citric acid, 1 to 2 g/L of phosphoric acid, 0.1 to 2.0 g/L of ammonium hydroxide, pH in the range of 2-5.

In another embodiment, the slurry includes two parts: Part 1—silica abrasive slurry, organic acid and acidic pH modulator, Part 2—alkaline pH modulator and acidic pH modulator. The slurry can be supplied to a polishing table as two components and allowed to mix on the polishing table to create slurry with the desired final composition. By using the same or different slurry flow rates, slurry composition can be varied during the polish to get desirable polish rates for oxide and nitride at different stages of polish. In another example, initially, Part 1 and Part 2 are used and after a certain time Part 2 is switched off to create slurry with a different oxide to nitride selectivity than the original formulation. Similar effects can be achieved by keeping the flow rate of one of the components constant and varying the other as polishing progresses.

In another embodiment the slurry includes two parts: Part 1—silica abrasive slurry, organic acid and acidic pH modulator, Part 2—silica abrasive slurry, alkaline pH modulator and acidic pH modulator. The slurry can be supplied to the table as two components and allowed to mix on the polishing table to create slurry with the desired final composition. By using the same or different slurry flow rates, slurry composition can be varied during the polish to get desirable polish rates for oxide and nitride at different stages of polish. Initially, Part 1 is used and after a certain time Part 1 is switched off and Part 2 is switched on to create slurry with a different oxide to nitride selectivity than the original formulation.

The slurry suitable for achieving FIG. 1F should have high nitride to oxide selectivity with no significant oxide and polysilicon polish rate.

Example 4

The slurry for achieving FIG. 1F may include: 5 W % of colloidal silica abrasives dispersed in water, 5 g/L of citric acid, 0.25 to 0.35 g/L of phosphoric acid, pH in the range of 2-3.

Example 5

An example of the formulation of example 4 includes: 5 to 10 W % of colloidal silica abrasive, 0.1 to 10 g/L of inorganic acid, pH in the range of 2 to 6. The preferred inorganic acid being Phosphoric acid.

Figure 2:
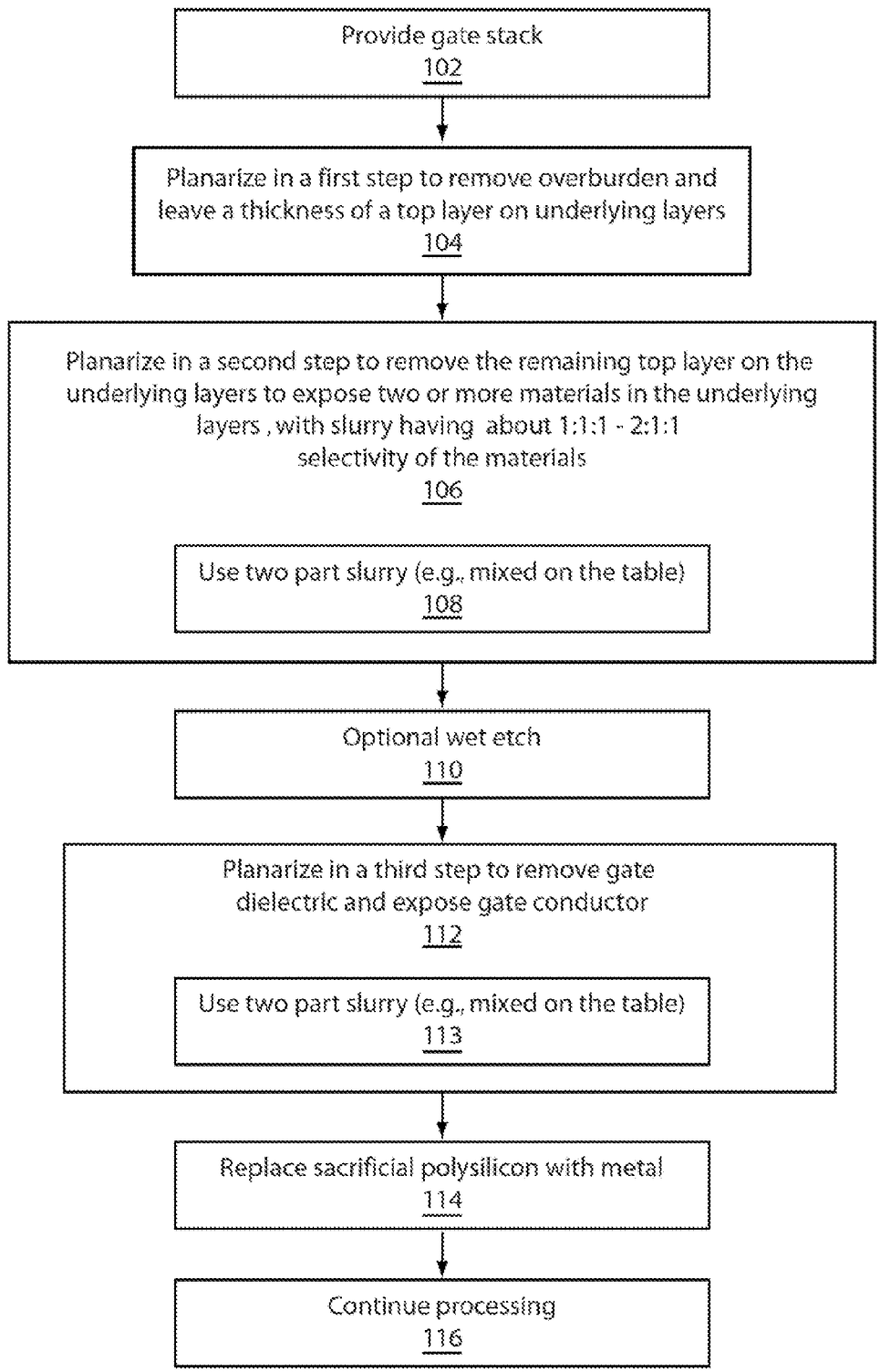
FIG. 2 is a block/flow diagram showing a multi-step polish process for replacement high-k metal gate structures in accordance with the present principles.

Referring to FIG. 2, a block/flow diagram shows a method for polishing for forming replacement high-k metal gate structures. In one embodiment, three polishing steps are employed to planarize oxide layers and to expose underlying nitride and polysilicon covered areas. In block 102, a gate stack is provided. The gate stack preferably includes a material that will be substituted out in favor of a metal gate conductor. In block 104, a first step chemical mechanical polish (step 1) is performed to remove overburden and planarize a top layer (e.g., oxide layer) leaving, e.g., a thickness of 300 to 600 Å remaining This polish may be accomplished by an oxide slurry containing silica abrasives or slurries containing ceria abrasives and a surfactant.

In block 106, a second chemical mechanical polish (step 2) removes the remaining portion of the top layer (oxide) to expose an underlying layer (nitride or polysilicon, if present) surface with oxide: nitride: polysilicon selectivity of about 1:1:1 to about 2:1:1 to accomplish a highly planar topography. In one embodiment, underlying layer is a dielectric layer (nitride) formed on a gate stack. The slurry for the step 2 polish includes silica abrasives dispersed in aqueous solutions from 0.5 to 30 W %, organic acid in the range of 0.01 to 30 g/L, acidic pH modulator in the range of 0.01 to 10 g/L, an alkaline pH modulator in the range of 0 to 15 g/L. The pH range of the slurry for step 2 is from 1 to 11.

A preferred composition of the slurry for step 2 includes 5 W % of colloidal silica abrasives dispersed in water, 0.5 to 50 g/L of organic acid having two or more carboxylic acid groups, 0.25 to 0.35 g/L of inorganic acid, 0.1 to 1.0 g/L of inorganic base, pH in the range of 2-5, the preferred pH being 4.

In one embodiment, the slurry can be used as a two part slurry in block 108, with the following composition: Part 1—0.5 to 30% silica abrasive slurry, 0.5 to 50 g/L organic acid, 0.01 to 5 g/L acidic pH modulator; Part 2—0.01 to 5 g/L alkaline pH modulator, 0.01 to 50 g/L acidic pH modulator. The slurry can be supplied to a polishing table as two components and allowed to mix on the polishing table to create slurry with the desired final composition. By using the same or different slurry flow rates, slurry composition can be varied during the polish to get desirable polish rates for oxide and nitride at different stages of polish.

In another embodiment, the slurry can be used as a two part slurry with the following composition: Part 1—0.5 to 30% silica abrasive slurry, 0.5 to 50 g/L organic acid, 0.01 to 5 g/L acidic pH modulator, Part 2—0.5 to 30% silica abrasive slurry, 0.01 to 5 g/L alkaline pH modulator, 0.01 to 50 g/L acidic pH modulator. The slurry can be supplied to the table as two components and allowed to mix on the polishing table to create slurry with the desired final composition. By using the same or different slurry flow rates, slurry composition can be varied during the polish to get desirable polish rates for oxide and nitride at different stages of polish. After this, a dilute HF wet etch may be used to ensure that at all locations in the structure (the nitride surface) are completely free of oxide in block 110.

In block 112, a third chemical mechanical polish removes the nitride layer(s) (of the gate) and exposes a gate conductor (polysilicon layers of the gate stack). The slurry for step 3 is capable of providing high polish rates for nitride and low polish rates for oxide and polysilicon. The composition of such a slurry may include: 5 to 10 W % of colloidal silica abrasive, 0.1 to 10 g/L of inorganic acid, pH in the range of 2 to 6. In block 113, a two part slurry may be employed (see block 108).

In block 114, the gate conductor (sacrificial polysilicon) is replaced by a metal layer. In block 116 processing continues to complete the device.

Having described preferred embodiments of systems and methods for fabrication of replacement metal gate devices (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for polishing to form replacement metal gate structures, comprising:
    a first chemical mechanical polish step to remove overburden and planarize a top layer to leave a planarized thickness over a gate structure;
    a second chemical mechanical polish step including removal of the planarized thickness to expose an underlying covered surface of a dielectric of the gate structure with a slurry configured to polish the top layer and the underlying covered surface substantially equally to accomplish a planar topography; and
    a third chemical mechanical polish step to remove the dielectric of the gate structure and expose a gate conductor.

2. The method as recited in claim 1, wherein the planarized thickness is between about 300 to about 600 Å.

3. The method as recited in claim 1, wherein the top layer includes oxide and the underlying covered surface includes nitride and polysilicon and the second chemical mechanical polish step includes a slurry with a oxide:nitride:polysilicon selectivity of about 1:1:1 to about 2:1:1.

4. The method as recited in claim 1, wherein the second chemical mechanical polish step includes a slurry having silica abrasives dispersed in aqueous solution from 0.5 to 30 W %.

5. The method as recited in claim 4, wherein the slurry includes organic acid in a range of 0.01 to 30 g/L.

6. The method as recited in claim 5, wherein the slurry includes an acidic pH modulator in a range of 0.01 to 10 g/L.

7. The method as recited in claim 6, wherein the slurry includes an alkaline pH modulator in a range of 0 to 15 g/L.

8. The method as recited in claim 7, wherein the slurry includes a pH range from 1 to 11.

9. The method as recited in claim 1, wherein the second chemical mechanical polish step includes a slurry having 5 W % of colloidal silica abrasives dispersed in water, 0.5 to 50 g/L of organic acid having two or more carboxylic acid groups, 0.25 to 0.35 g/L of inorganic acid, 0.1 to 1.0 g/L of inorganic base, and a pH in the range of 2-5.

10. The method as recited in claim 1, wherein the second chemical mechanical polish step includes a two part slurry with a composition of:
    a first part having 0.5 to 30% silica abrasive slurry, 0.5 to 50 g/L organic acid, and 0.01 to 5 g/L acidic pH modulator; and
    a second part having 0.01 to 5 g/L alkaline pH modulator, and 0.01 to 50 g/L acidic pH modulator.

11. The method as recited in claim 1, further comprising supplying a slurry to a polishing table as two components to mix on the polishing table to create a final composition and using the same or different slurry flow rates such that a slurry composition is varied during the polish.

12. The method as recited in claim 1, wherein the second chemical mechanical polish step includes a two part slurry with a composition of:
    a first part having 0.5 to 30% silica abrasive slurry, 0.5 to 50 g/L organic acid, and 0.01 to 5 g/L acidic pH modulator; and
    a second part having 0.5 to 30% silica abrasive slurry, 0.01 to 5 g/L alkaline pH modulator and 0.01 to 50 g/L acidic pH modulator.

13. The method as recited in claim 1, further comprising wet etching to ensure the top layer is completely removed from the dielectric of the gate structure.

14. The method as recited in claim 1, wherein the third chemical mechanical polish step includes a slurry capable of a higher polishing rate for the dielectric of the gate structure and lower polishing rates for the top layer and the gate conductor.

15. The method as recited in claim 1, wherein the third chemical mechanical polish step includes a slurry composition of: 5 to 10 W % of colloidal silica abrasive, 0.1 to 10 g/L of inorganic acid, and a pH in the range of 2 to 6.

16. A method for polishing replacement metal gate structures to planarize oxide layers and expose underlying nitride and polysilicon covered areas, comprising:
    a first chemical mechanical polish step to remove overburden and planarize oxide layers leaving 300 to 600 Å of oxide remaining;
    a second chemical mechanical polish step including removal of the oxide layers and exposing underlying nitride and polysilicon covered surfaces with an oxide:nitride:polysilicon selectivity of about 1:1:1 to about 2:1:1 to provide planar topography;
    a third chemical mechanical polish step to remove the nitride layers and expose the polysilicon layers; and
    replacing at least a portion of the polysilicon layer with a metal layer to form the metal gate structure.

17. The method as recited in claim 16, wherein the second chemical mechanical polish step includes a slurry including silica abrasives dispersed in aqueous solution from 0.5 to 30 W %, organic acid in a range of 0.01 to 30 g/L, an acidic pH modulator in a range of 0.01 to 10 g/L, an alkaline pH modulator in a range of 0 to 15 g/L, and a pH range from 1 to 11.

18. The method as recited in claim 16, wherein the second chemical mechanical polish step includes a slurry having 5 W % of colloidal silica abrasives dispersed in water, 0.5 to 50 g/L of organic acid having two or more carboxylic acid groups, 0.25 to 0.35 g/L of inorganic acid, 0.1 to 1.0 g/L of inorganic base, a pH in the range of 2-5.

19. The method as recited in claim 16, wherein the second chemical mechanical polish step includes a two part slurry with a composition of:

a first part having 0.5 to 30% silica abrasive slurry, 0.5 to 50 g/L organic acid, and 0.01 to 5 g/L acidic pH modulator; and a second part having 0.01 to 5 g/L alkaline pH modulator, and 0.01 to 50 g/L acidic pH modulator.

20. The method as recited in claim 16, further comprising supplying a slurry to a polishing table as two components to mix on the polishing table to create a final composition and using the same or different slurry flow rates such that a slurry composition is varied during the polish.

21. The method as recited in claim 16, wherein the second chemical mechanical polish step includes a two part slurry with a composition of:

a first part having 0.5 to 30% silica abrasive slurry, 0.5 to 50 g/L organic acid, and 0.01 to 5 g/L acidic pH modulator; and a second part having 0.5 to 30% silica abrasive slurry, 0.01 to 5 g/L alkaline pH modulator and 0.01 to 50 g/L acidic pH modulator.

22. The method as recited in claim 16, further comprising wet etching to ensure the oxide layer is completely removed from the nitride of a gate structure.

23. The method as recited in claim 16, wherein the third chemical mechanical polish step includes a slurry capable of a higher polishing rate for the nitride of a gate structure and lower polishing rates for oxide and polysilicon.

24. The method as recited in claim 16, wherein the third chemical mechanical polish step includes a slurry composition of: 5 to 10 W % of colloidal silica abrasive, 0.1 to 10 g/L of inorganic acid, and a pH in the range of 2 to 6.

* * * * *